(12) United States Patent
Park et al.

(10) Patent No.: US 9,818,481 B2
(45) Date of Patent: Nov. 14, 2017

(54) RESISTIVE MEMORY DEVICE AND OPERATION METHOD THEREOF

(71) Applicant: SK hynix Inc., Gyeonggi-do (KR)

(72) Inventors: Hae Chan Park, Gyeonggi-do (KR); Myoung Sub Kim, Gyeonggi-do (KR); Se Ho Lee, Gyeonggi-do (KR); Seung Yun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/434,458

(22) Filed: Feb. 16, 2017

(65) Prior Publication Data

US 2017/0162262 A1 Jun. 8, 2017

Related U.S. Application Data

(62) Division of application No. 14/043,524, filed on Oct. 1, 2013, now Pat. No. 9,613,690.

(30) Foreign Application Priority Data

Apr. 25, 2013 (KR) ........................ 10-2013-0046089

(51) Int. Cl.
*G11C 7/00* (2006.01)
*G11C 13/00* (2006.01)
*G11C 11/56* (2006.01)

(52) U.S. Cl.
CPC ...... *G11C 13/0069* (2013.01); *G11C 11/5678* (2013.01); *G11C 13/004* (2013.01); *G11C 13/0033* (2013.01); *G11C 13/0064* (2013.01); *G11C 13/0097* (2013.01); *G11C 2013/0092* (2013.01); *G11C 2213/15* (2013.01)

(58) Field of Classification Search
CPC .............. G11C 13/0069; G11C 13/004; G11C 11/5678; G11C 13/0097; G11C 13/0064; G11C 13/0033
USPC ............................................ 365/148, 189.16
See application file for complete search history.

(56) References Cited

U.S. PATENT DOCUMENTS

| | | | | |
|---|---|---|---|---|
| 7,764,534 B2 * | 7/2010 | Thorp | ................ | G11C 13/0004 365/105 |
| 7,812,404 B2 * | 10/2010 | Herner | ................ | G11C 11/5685 257/390 |
| 8,659,931 B1 * | 2/2014 | Ertosun | .............. | G11C 13/0007 365/148 |
| 9,349,448 B2 * | 5/2016 | Shepard | | |

(Continued)

FOREIGN PATENT DOCUMENTS

CN 102667947 9/2012

*Primary Examiner* — Viet Q Nguyen
(74) *Attorney, Agent, or Firm* — IP & T Group LLP (57) ABSTRACT

A resistive memory device includes a memory cell array including a unit memory cell coupled between a word line and a bit line, wherein the unit memory cell includes a data storage material and a non-silicon-substrate-based type bidirectional access device coupled in series, a path setting circuit coupled between the bit line and the word line, suitable for providing a program pulse toward the bit line or the word line based on a path control signal, a forward write command, and a reverse write command, and a control unit suitable for providing a write path control signal, a forward program command, and a reverse program command based on an external command signal.

4 Claims, 10 Drawing Sheets

(56) References Cited

U.S. PATENT DOCUMENTS

| | | | |
|---|---|---|---|
| 2010/0078758 A1* | 4/2010 | Sekar | H01L 27/2418 257/530 |
| 2010/0124105 A1 | 5/2010 | Wang et al. | |
| 2010/0321981 A1 | 12/2010 | Jeon et al. | |
| 2011/0128772 A1 | 6/2011 | Kim et al. | |
| 2011/0273926 A1* | 11/2011 | Wu | G11C 11/16 365/158 |
| 2014/0325120 A1* | 10/2014 | Park | G11C 13/003 711/103 |

* cited by examiner

RESISTIVE MEMORY DEVICE AND OPERATION METHOD THEREOF

CROSS-REFERENCES TO RELATED APPLICATION

This application is a division of U.S. patent application Ser. No. 14/043,524 filed on Oct. 1, 2013, which claims priority under 35 U.S.C. §119(a) to Korean application number 10-2013-0046089, filed on Apr. 25, 2013. The disclosure of each of the foregoing application is incorporated herein by reference in its entirety.

BACKGROUND

1. Technical Field

The inventive concept relates to a semiconductor integrated circuit, and more particularly, to a resistive memory device.

2. Related Art

Resistive memory devices use a resistive material of which a resistance is sharply changed based on an applied voltage to switch at least two different resistance states. There are typically a phase-change random access memory (PCRAM), a resistive random access memory (ReRAM), and a magnetoresistive random access memory (MRAM) as the resistive memory devices.

Among the resistive memory devices, the PCRAM determines data to be stored in the selected memory cell based on a crystalline state of a phase-change material. By heating the phase-change material, a phase of the phase-change material may be changed, and thus the resistance state may be controlled. The PCRAM has advantages of stability, unnecessity of an erase operation, endurance, support of access in byte units in addition to non-volatility and support of high-speed operation.

Recently, to obtain high capacity and high integration, the PCRAM is required to support a multi-level cell structure.

Figure 1A:
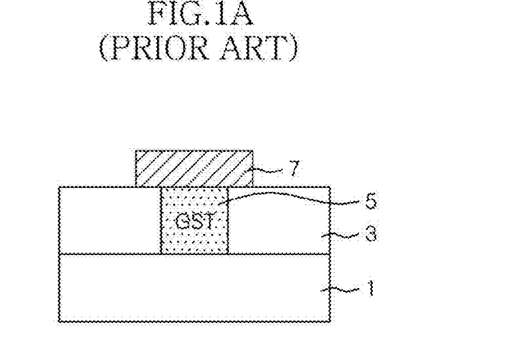
FIGS. 1A and 1B are cross-sectional views for explaining characteristics of a conventional PCRAM.
Figure 1B:
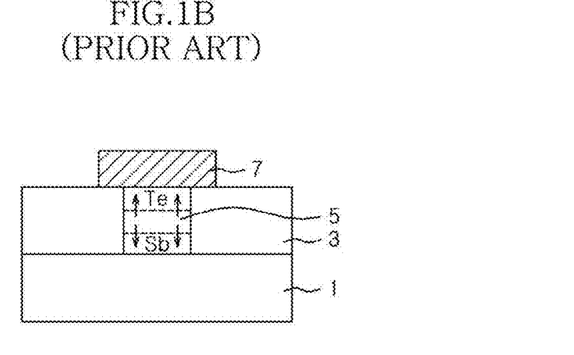

FIGS. 1A and 1B are cross-sectional views for explaining characteristics of a conventional PCRAM.

As illustrated in FIG. 1A, the conventional PCRAM includes a semiconductor substrate 1 in which a bottom structure including an access device (not shown) and a heating electrode (not shown) is formed, a phase-change material layer 5 formed to be in contact with the heating electrode within the semiconductor substrate 1, and an upper electrode 7 formed on the phase-change material 5. The phase-change material 5 is insulated from the adjacent phase-change material by an insulating layer 3.

The phase-change material 5 may be formed using a chalcogenide material, for example, germanium-antimony-tellurium (hereinafter, referred to as GST or Ge—Sb—Te). However, the GST material causes a phase-separation due to repeated crystallization and amorphization.

Therefore, as illustrated in FIG. 1B, as the number of use of the PCRAM is increased, antimony (Sb) within the GST material migrates toward a side of the heating electrode, and tellurium (Te) within the GST material migrates toward a side of the upper electrode 7.

Figure 2A:
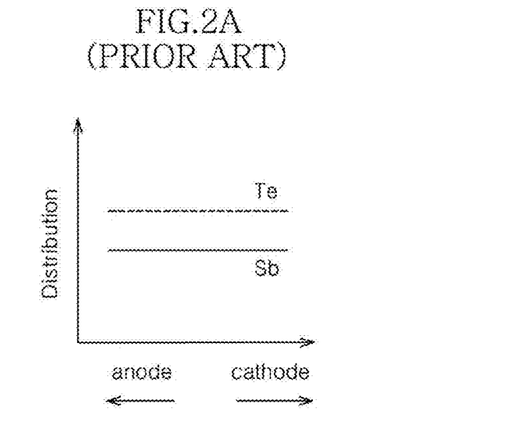
FIGS. 2A and 2B are distribution diagrams for explaining phase-separation of a GST material.
Figure 2B:
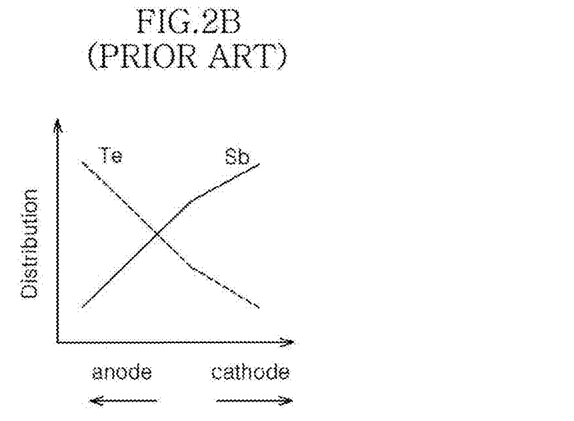

FIGS. 2A and 2B are distribution diagrams for explaining the phase-separation of the GST material.

FIG. 2A shows the distribution of elements constituting a GST material in an initial state, and FIG. 2B shows the distribution of element constituting the GST material after the certain number of repeated write operations, for example, program operations, are performed.

As seen from FIG. 2A, tellurium (Te) and antimony (Sb) are uniformly distributed in a side of an anode, for example, an upper electrode and a side of a cathode, for example, a heating electrode. However, as operation cycles are repeated, tellurium (Te) migrates toward the anode and is concentrated in the anode side, whereas antimony (Sb) migrates toward the cathode and is concentrated in the cathode side.

Such phase-separation is caused when the elements constituting the GST material are pulled by an electric field. A resistance of the phase-change material in an amorphous state becomes low.

Figure 3A:
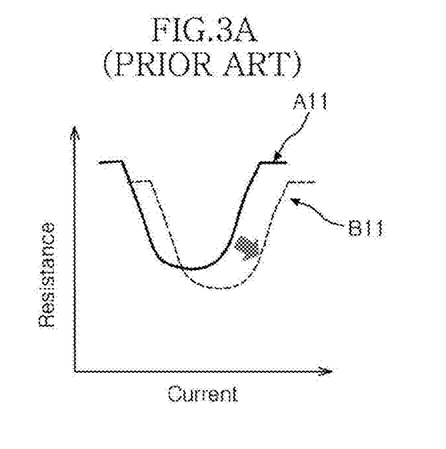
FIGS. 3A and 3B are characteristic diagrams illustrating current and voltage characteristics changes of a PCRAM due to repeated write operations.
Figure 3B:
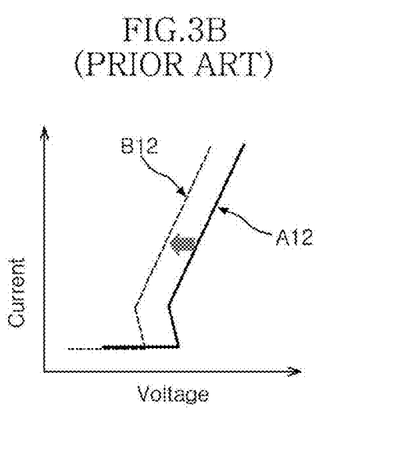

FIGS. 3A and 3B are characteristic diagrams illustrating current and voltage characteristic changes of a PCRAM due to the repeated write operations.

FIG. 3A illustrates a change of a resistance-current characteristic of the PCRAM due to the repeated write operations. When comparing a resistance-current characteristic curve A11 in an initial operation and a resistance-current characteristic curve B11 after the phase-separation is caused by repeated operation cycles, it may be seen that a resistance of a phase-change material, for example, a GST material, after the phase-separation is reduced. Reduction in the resistance of the phase-change material means increase in a reset current and thus an operation voltage of the PCRAM is increased.

FIG. 3B illustrates a change of a current-voltage characteristic of a PCRAM due to the repeated write operations. When comparing a current-voltage characteristic curve A12 in an initial operation and a current-voltage characteristic B12 after the phase-separation, it may be seen that a voltage is totally dropped when the same driving current is applied. That is, it may be seen that a threshold voltage is lowered after the phase-separation of a phase-change material, for example, a GST material, and thus malfunction of the PCRAM may be caused.

Figure 4A:
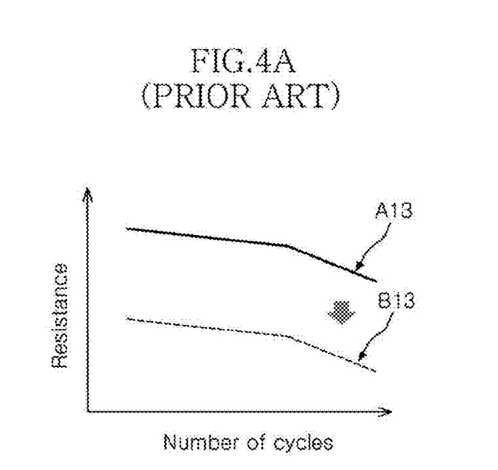
FIGS. 4A and 4B are characteristic diagrams illustrating reliability change of a PCRAM due to repeated write operations.
Figure 4B:
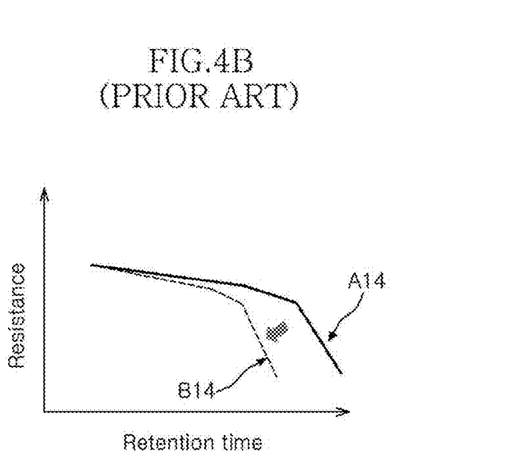

FIGS. 4A and 4B are characteristic diagrams illustrating reliability change of a PCRAM due to repeated write operations.

First, FIG. 4A illustrates endurance change of a PCRAM due to the repeated write operations. It may be seen that as the number of write operations is increased, a resistance of a phase-change material, for example, a GST material, is lowered from A13 to B13, and thus endurance is degraded.

FIG. 4B illustrates a change of a retention characteristic of a PCRAM due to the repeated write operations of the PCRAM. When comparing the retention characteristic curve A14 in an initial operation and the retention characteristic curve B14 after the phase-separation, it may be seen that the data retention characteristic is remarkably degraded.

As described above, the reliability of PCRAM is degraded and the lifespan of PCRAM is limited due to the phase-separation of the phase-change material, for example, a GST material, caused by the repeated operations.

To alleviate these concerns, refresh operation of the PCRAM may be considered. However, when the refresh operation, including, for example, an erase operation, is performed in a separate operation period, a time for the refresh operation may be additionally needed, and thus write latency may be increased.

SUMMARY

According to one aspect of an exemplary embodiment, a resistive memory device may include a data storage material coupled to a first interconnection, and a non-silicon-substrate-based type bidirectional access device coupled between the data storage material and a second interconnection.

According to one aspect of an exemplary embodiment, a memory device may include a memory cell array including a unit memory cell coupled between a word line and a bit line, wherein the unit memory cell includes a data storage material and a non-silicon-substrate-based type bidirectional access device coupled in series, a path setting circuit coupled between the bit line and the word line, suitable for providing a program pulse toward the bit line or the word line based on a path control signal, a forward write command, and a reverse write command, and a control unit suitable for providing a write path control signal, a forward program command, and a reverse program command based on an external command signal.

According to another aspect of an exemplary embodiment, a data processing system may include a resistive memory device including a memory cell array, a control unit suitable for controlling an operation of the memory cell array, and a path setting circuit suitable for providing a program pulse to the memory cell array, and a memory controller suitable for accessing the resistive memory device in response to request of a host. The memory cell array may include a unit memory cell connected between a word line and a bit line, and including a data storage material and a non-silicon-substrate-based type bidirectional access device. The write control circuit may be connected between the bit line and the word line, and is suitable for providing the program pulse to the bit line or the word line in response to a path control signal, a forward program command, and a reverse program command provided from the control unit.

According to another aspect of an exemplary embodiment, a data processing system may include a processor, an operation memory suitable for storing an application, data, and a control signal required for an operation of the processor, a resistive memory device which includes a memory cell array with a plurality of unit memory cells accessed by the processor and connected between bit lines and word lines, a control unit suitable for controlling an operation of the memory cell array, and a path setting circuit suitable for providing a program pulse to the memory cell array, and a user interface suitable for performing input and output between the processor and a user. The memory cell array may include a unit memory cell connected between a word line and a bit line, and including a data storage material and a non-silicon-substrate-based type bidirectional access device. The path setting circuit is connected between the bit line and the word line, and suitable for providing the program pulse to the bit line or the word line in response to a path control signal, a forward write command, and a reverse program command provided from the control unit.

According to another aspect of an exemplary embodiment, an operation method of a resistive memory device including a unit memory cell, which includes a data storage material coupled to a first interconnection, a non-silicon-substrate-based type bidirectional access device coupled between the data storage material and a second interconnection, and a path setting circuit suitable for providing a program pulse to the unit memory cell. The operation method may include applying the program pulse to a side of the first interconnection from the path setting circuit in at least portion of cycles of a program operation in response to a program command, and applying the program pulse to a side of the second interconnection from the path setting circuit in the remaining cycles of the program operation in response to the program command.

According to another aspect of an exemplary embodiment, an operation method of a resistive memory device with a unit memory cell, the operation method includes providing a forward program current path for the unit memory cell by applying a program pulse in a forward direction, and providing a reverse program current path for the unit memory cell by applying the program pulse in a reverse direction, wherein the unit memory cell includes a data storage material and a non-silicon-substrate-based type bidirectional access device coupled in series between a first interconnection and a second interconnection.

According to another aspect of an exemplary embodiment, a resistive memory device includes a memory cell array with a plurality of unit memory cells coupled between column lines and row lines, and a path setting circuit suitable for selecting a unit memory cell to be programmed, and providing a forward program current path or a reverse program current path for the selected unit memory cell, via the corresponding column line and the corresponding row line.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 5:
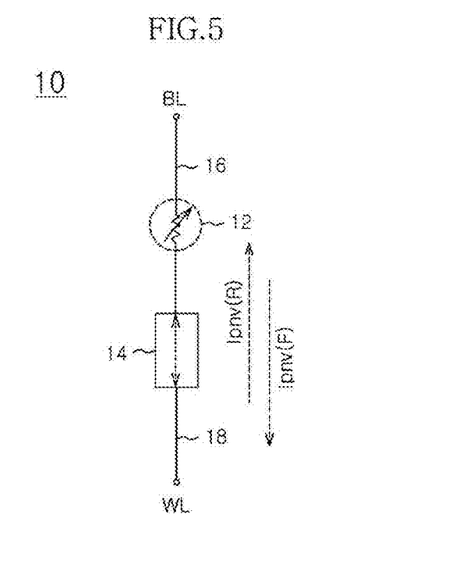
FIG. 5 is a diagram illustrating a unit memory cell of a resistive memory device according to an exemplary embodiment of the inventive concept.

FIG. 5 is a diagram illustrating a unit memory cell of a resistive memory device according to an exemplary embodiment of the inventive concept.

As illustrated in FIG. 5, the unit memory cell 10 of a resistive memory device according to an exemplary embodiment of the inventive concept may include a data storage material 12 and a bidirectional access device 14 connected in series.

More specifically, one terminal of the data storage material 12 is connected to a first interconnection 16, for example, a bit line BL or a conductive line electrically connected to the bit line BL. Further, one terminal of the bidirectional access device 14 connected to the data storage material 12 in series is connected to a second interconnection 18, for example, a word line WL or a conductive line electrically connected to the word line WL.

That is, the bidirectional access device 14 applied to the inventive concept may be a device of which terminals configured to input and output current are connected to the word line and the bit line through interconnections, and thus may be referred to as an interconnection-connection type bidirectional access device or a non-silicon-substrate-based type bidirectional access device. The interconnection-connection type bidirectional access device may be, for example, a transistor, a mixed ionic-electronic conductor (MIEC) device, an ovonic threshold switching (OTS) device, a zener diode, or the like, but the interconnection-connection type bidirectional access device is not limited thereto.

One terminal of the silicon (Si) substrate-based bidirectional access device is in contact with the Si substrate, for example, for providing a well bias or a ground terminal. Therefore, when a reverse bias is applied to the Si substrate-based bidirectional access device, data may not be programmed in the data storage material 12 by an alternating current (AC) bias. This is because the capacitance of the Si substrate itself is large. Therefore, the bidirectional access device may not apply enough energy for changing a polarity applied to the data storage material 12.

On the other hand, in the bidirectional access device 14, of which terminals are connected to interconnections, by applying an AC bias, current may flow in a forward direction or a reverse direction, and direction change of current flow leads to change of the polarity applied to the data storage material 12.

That is, the resistive memory device may control a direction of current flowing in the unit memory cell 10 through the bidirectional access device 14. Therefore, a forward current path Ipnv(F) from the bit line BL to the word line WL via the first interconnection 16, the data storage material 12, the access device 14, and the second interconnection 18, and a reverse current path Ipnv(R) from the word line WL to the bit line BL via the second interconnection 18, the access device 14, the data storage material 12, and the first interconnection 16 may be formed.

When the forward current path is formed, the terminal of the data storage material 12 in a side of the bit line BL may serve as an anode, and the terminal thereof connected to the bidirectional access device 14 may serve as a cathode. When the reverse current path is formed, the terminal of the data storage material 12 in the side of the bit line BL may serve as the cathode, and the terminal thereof connected to the bidirectional access device 14 may serve as the anode.

Further, since the terminals of the bidirectional access device 14 are connected to the word line and the bit line through the interconnections, the current path may be changed by a program pulse (AC bias) provided in a program and verify (PNV) operation.

Therefore, the resistive memory device with the unit memory cell 10 illustrated in FIG. 5 may perform the forward PNV operation through the forward current path and the reverse PNV operation through the reverse current path. Accordingly, since the polarity applied to the data storage material 12 is changed according to the current path, the distribution of elements included in the data storage material 12 may be refreshed.

Here, the data storage material 12 may include a phase-change material, for example, a GST material. Among elements constituting the GST material, tellurium (Te) has a property to move toward the anode, and antimony (Sb) has a property to move toward the cathode. In the exemplary embodiment of the inventive concept, when the PNV operation is performed by appropriately utilizing both the forward current path and the reverse current path (hereinafter, referred to as "mixing" or "mix"), phase-separation of tellurium (Te) and antimony (Sb) may be effectively prevented.

To obtain the effect, controlling the current path in the PNV operation is needed.

Figure 6:
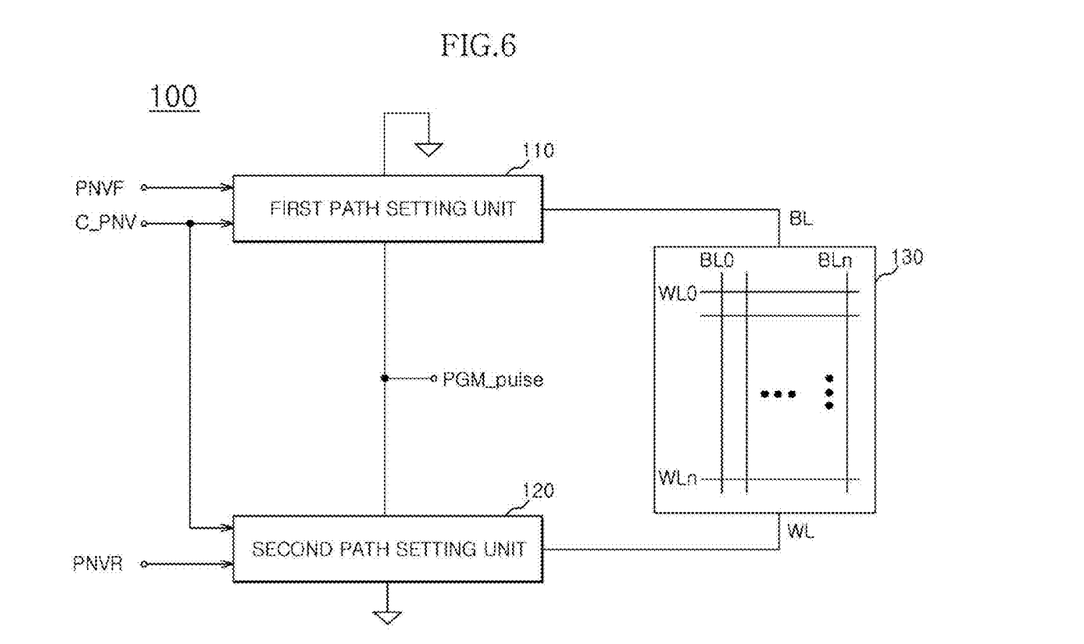
FIG. 6 is a block diagram illustrating a path setting circuit of a resistive memory device according to an exemplary embodiment of the inventive concept.

FIG. 6 is a block diagram illustrating a path setting circuit of a resistive memory device according to an exemplary embodiment of the inventive concept.

As illustrated in FIG. 6, a path setting circuit 100 may include a first path setting unit 110 and a second path setting unit 120.

The first path setting unit 110 may couple a bit line BL within the memory cell array 130 with a terminal for supplying a program pulse PGM_pulse or a terminal for supplying a ground voltage, in response to a path control signal C_PNV and a forward program command PNVF.

The second path setting unit 120 may couple a word line WL within the memory cell array 130 with the terminal for supplying the program pulse PGM_pulse or the terminal for supplying the ground voltage based on the path control signal C_PNV and a reverse program command PNVR.

Figure 15:
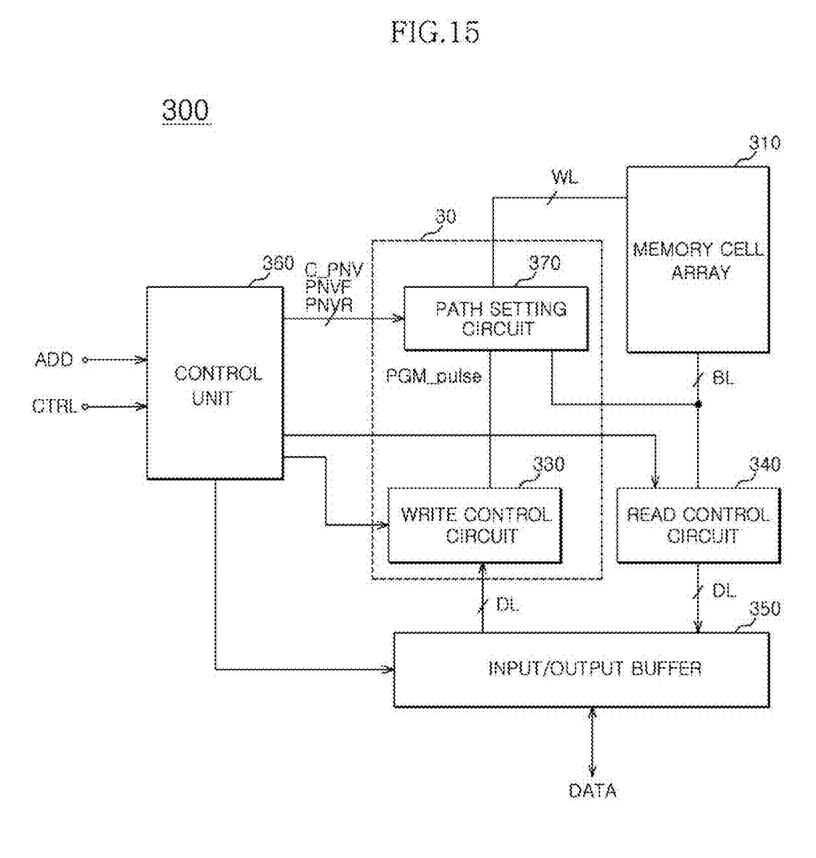
FIG. 15 is a block diagram illustrating a resistive memory device according to an exemplary embodiment of the inventive concept.

The path control signal C_PNV, the forward program command PNVF, and the reverse program command PNVR may be provided from a control unit (see 360 of FIG. 15). The path control signal C_PNV may be generated based on an external program command, and the forward program command PNVF and the reverse program command PNVR may be complementary signals generated based on the number of programming upon the unit memory cell within the memory cell array 130.

The memory cell array 130 includes a plurality of unit memory cells coupled between a plurality of word lines WL0 to WLm and a plurality of bit lines BL0 to BLn, and each of the unit memory cells may include the data storage material and the bidirectional access device connected in series as illustrated in FIG. 5.

Figure 7:
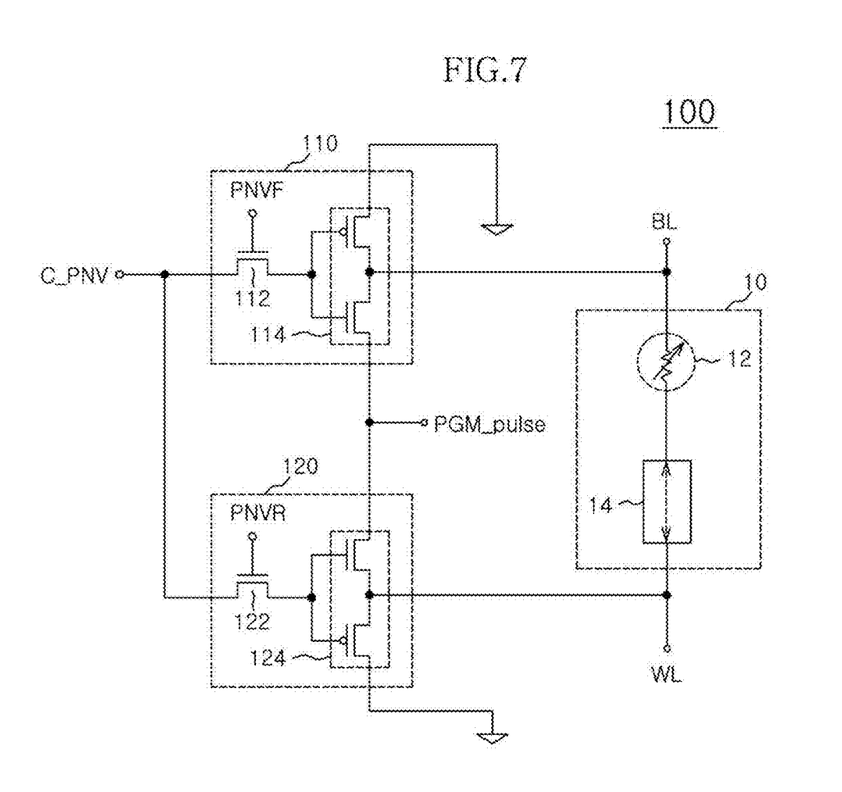
FIG. 7 is an a detailed diagram illustrating the path setting circuit shown in FIG. 6.

FIG. 7 is a detailed diagram illustrating the path setting circuit shown in FIG. 6.

Referring to FIG. 7, the first path setting unit 110 may include a first switch, for example, NMOS transistor, 112 configured to receive the path control signal C_PNV and be driven based on the forward program command PNVF, and a first driver 114 connected between the terminal for supplying the ground voltage and the terminal for supplying the program pulse PGM_pulse, and configured to drive the bit line BL with the ground voltage or the program pulse PGM_pulse based on an output signal of the first switch 112. Here, the first driver 114 may be realized by using a NMOS transistor and a PMOS transistor.

The second path setting unit 120 may include a second switch, for example, NMOS transistor, 122 configured to receive the path control signal C_PNV and be driven in response to the reverse program command PNVR, and a second driver 124 connected between the terminal for supplying the ground voltage and the terminal for supplying the program pulse PGM_pulse, and configured to drive the word line WL with the ground voltage or the program pulse PGM_pulse based on an output signal of the second switch 122. Here, the first driver 124 may be realized by using an NMOS transistor and a PMOS transistor.

In FIG. 7, the first driver 114 and the second driver 124 may be devices configured to output an AC type program pulse to the output terminals thereof.

The unit memory cell 10 is connected between the bit line BL and the word line WL, and may include the data storage material 12 and the bidirectional access device 14.

As described above, the forward program command PNVF and the reverse program command PNVR may be complementary signals generated based on the number of programming upon the unit memory cell 10.

Figure 8:
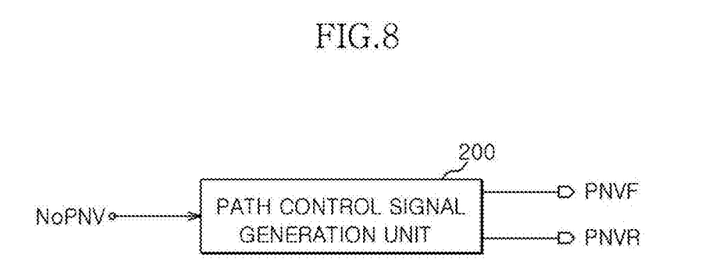
FIG. 8 is a block diagram illustrating a path control signal generation unit.

FIG. 8 is a block diagram illustrating a path control signal generation unit.

Referring to FIG. 8, the path control signal generation unit 200 generates a forward program command PNVF and a reverse program command PNVR based on a program number count signal NoPNV.

The PNV operation by the forward current path Ipnv(F) set by the forward program command PNVF and the reverse PNV operation by the reverse current Ipnv(R) set by the reverse program command PNVR may be used through appropriate mixing thereof in an operation of the memory device.

The program sequence of the reverse program mixed with the forward program operation may be previously set by a memory controller (or a memory device manufacturer or a user).

In an exemplary embodiment, the path control signal generation unit 200 may output the forward program command PNVF and the reverse program command PNVR as the complementary signals when the number of programming denoted by the programming number counter signal NoPNV is a multiple of the predetermined number of times. In another exemplary embodiment, the path control signal generation unit 200 may output the forward program command PNVF and the reverse program command PNVR as the complementary signals when the number of programming denoted by the program number counter signal NoPNV matches at least one of predetermined references.

Therefore, the path setting circuit 100 drives (or transfers) the program pulse PGM_pulse to the bit line BL when the path control signal C_PNV is activated, for example, to a logic high level, the forward program command PNVF is activated, for example, to a logic high level, and the reverse program command PNVR is deactivated, for example, to a logic low level. Therefore, a write path via the data storage material 12 and the bidirectional access device 14 may be formed and data corresponding to the program pulse PGM_pulse may be stored in the data storage material 12.

On the other hand, the path setting circuit 100 drives (or transfers) the program pulse PGM_pulse to the word line WL when the path control signal C_PNV is activated, for example, to a logic high level, the forward program command PNVF is inactivated, for example, to a logic low level, and the reverse program command PNVR is activated, for example, to a logic high level. Therefore, a write path via the bidirectional access device 14 and the data storage material 12 may be formed and data corresponding to the program pulse PGM_pulse may be stored in the data storage material 12.

Figure 9:
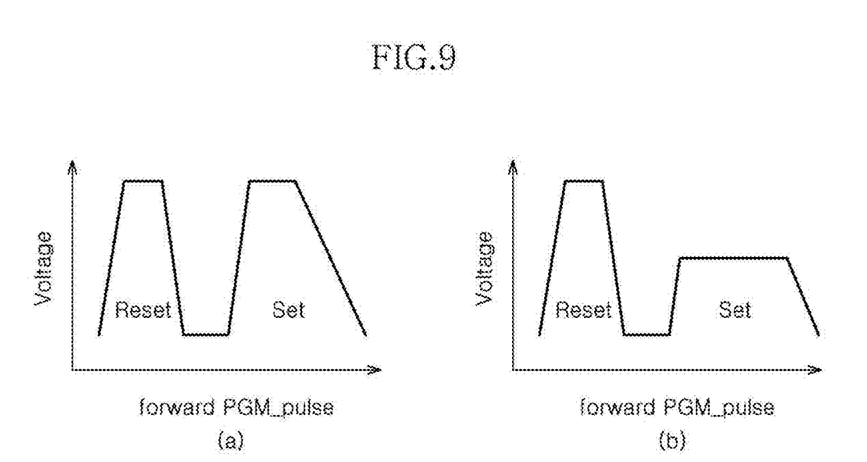
FIGS. 9 and 10 are graphs illustrating a program and verify (PNV) pulse applied to an exemplary embodiment of the inventive concept.
Figure 10:
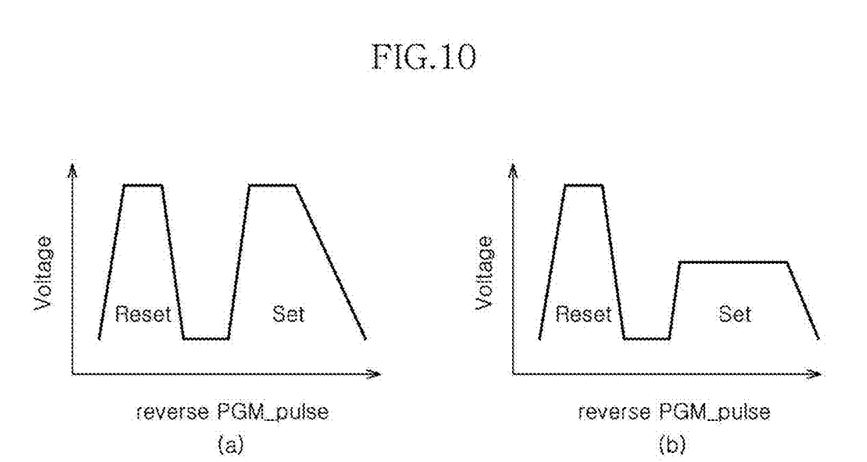

FIGS. 9 and 10 are graphs illustrating a PNV pulse applied to the exemplary embodiment of the inventive concept.

As described above, the embodiment of the inventive concept may perform programming on the data storage material in the forward direction or the reverse direction, by introducing the interconnection-connection type bidirectional access device. That is, an Ac bias may be supplied through a current path formed from a bit line toward a word line, and the AC bias may be supplied through a current path formed from the word line toward the bit line.

Here, the program pulse PGM_pulse may be supplied in the same shape in the forward direction and in the reverse direction.

That is, as illustrated in FIG. 9(*a*), a large amount of current may be applied to perform a forward directional programming to a reset state for a short time, and a current having a slow quench waveform may be applied to perform the forward directional programming to a set state. Accordingly, the pulse having the same shape as in the forward directional programming may be applied in a reverse directional programming to a reset state as illustrated in FIG. 10(*a*).

FIG. 9(*b*) illustrates a program pulse of a rectangular waveform applied to perform a forward directional programming to the set state, and the program pulse having the same shape as illustrated in FIG. 10(*b*) may be applied in the reverse directional programming to the set state.

FIGS. 11A, 11B, 12A, 12B, 13A, and 13B are illustrative views for explaining an operation method of a resistive memory device according to an exemplary embodiment of the inventive concept.

Figure 11A:
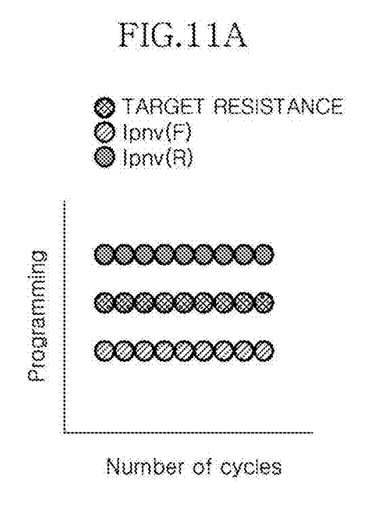
FIGS. 11A, 11B, 12A, 12B, 13A, and 13B are illustrative views for explaining an operation method of a resistive memory device according to an exemplary embodiment of the inventive concept.
Figure 11B:
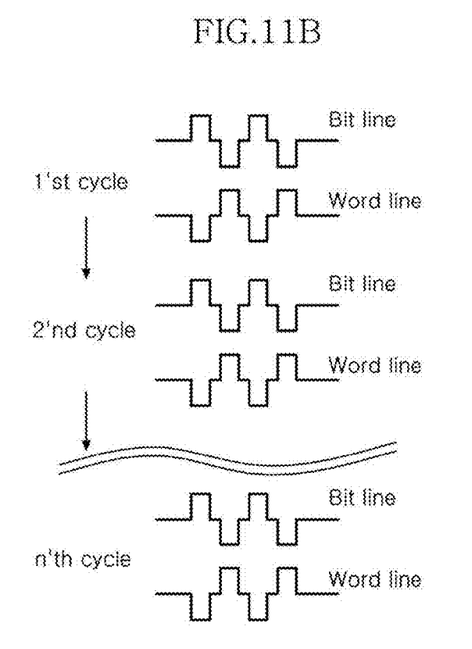

FIGS. 11A and 11B illustrate a case in which a forward directional programming and a reverse directional programming are performed in one program operation (or in one program cycle). Since all the forward directional programming and the reverse directional programming are performed in one program operation, phase-separation of a phase storage material may be fundamentally prevented.

Figure 12A:
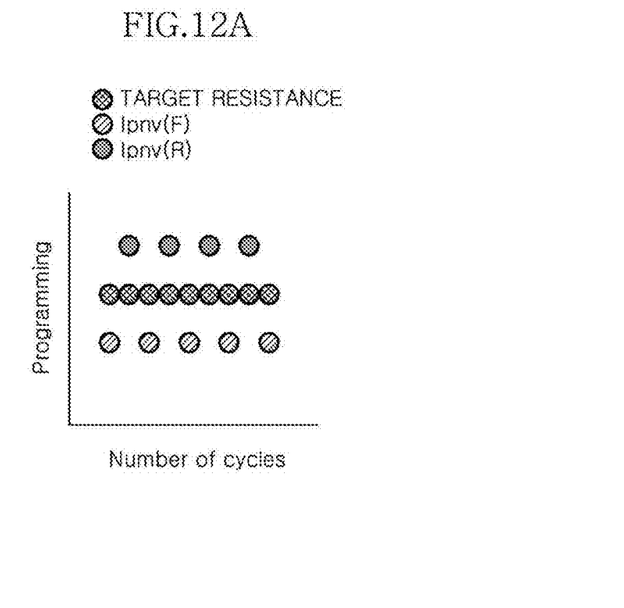
Figure 12B:
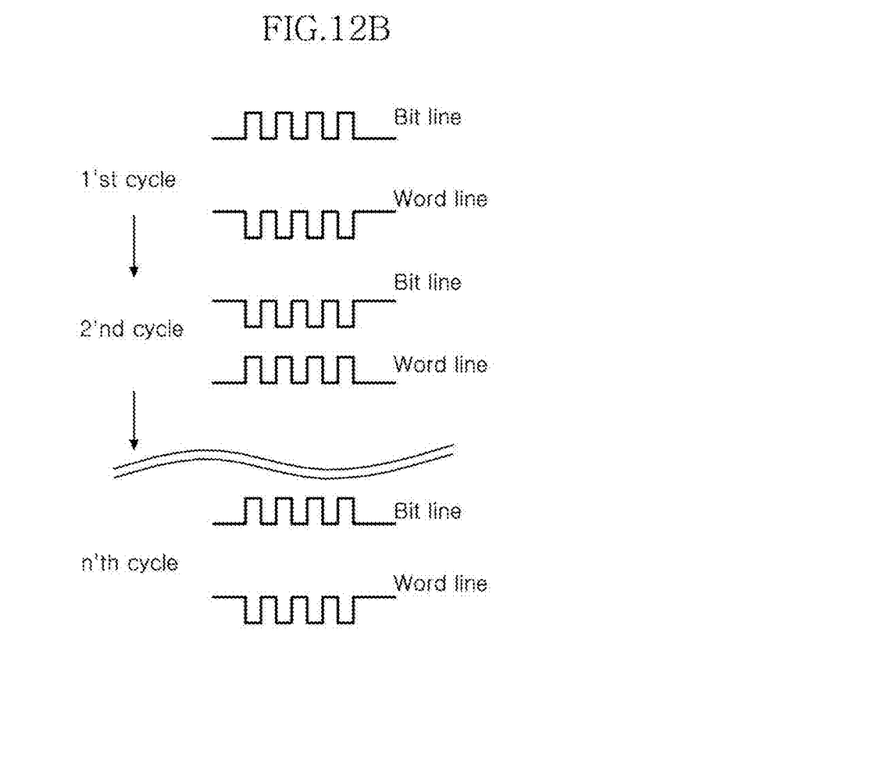

FIGS. 12A and 12B illustrate a case in which PNV is performed by alternately forming a forward current path Ipnv(F) and a reverse current path Ipnv(R) so that a resistance state of the data storage material matches a target resistance level.

In a first PNV cycle, a forward current path is formed and a program pulse is provided from a bit line side to a word line side, and a second PNV cycle, a reverse current path is formed and the program pulse is provided from the word line side to the bit line side.

By performing both the forward directional programming and the reverse directional programming, the phase-separation of elements constituting a data storage material may be suppressed, and reliability and lifespan of the resistive memory device may be improved.

Figure 13A:
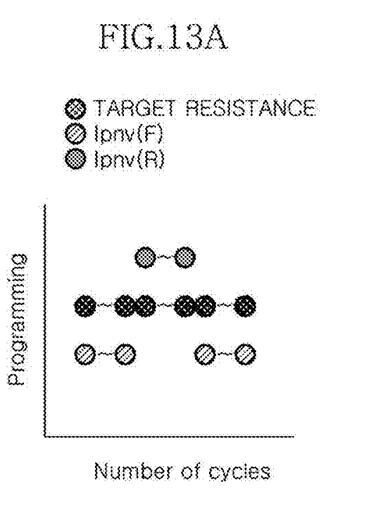
Figure 13B:
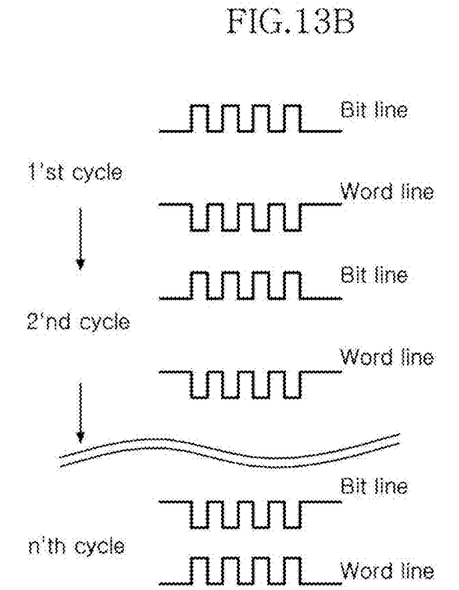

FIGS. 13A and 13B illustrate in a case in which at least one reverse directional programming is performed while forward directional programming is performed predetermined times among the PNV cycles.

By performing the forward directional programming several times, the phase-separation of the elements constituting a data storage material may be caused. However, in the exemplary embodiment, before the degree of phase-separation affects reliability of the memory device, at least one reverse directional programming is performed so that an element distribution state of a data storage material is refreshed.

Figure 14A:
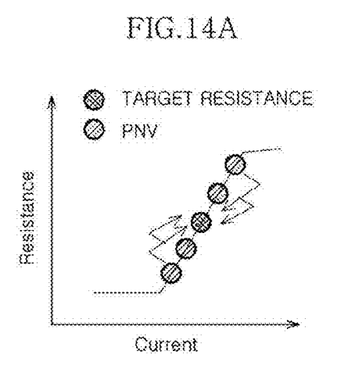
FIGS. 14A and 14B are illustrative views illustrating the PNV concept of a resistive memory device.
Figure 14B:
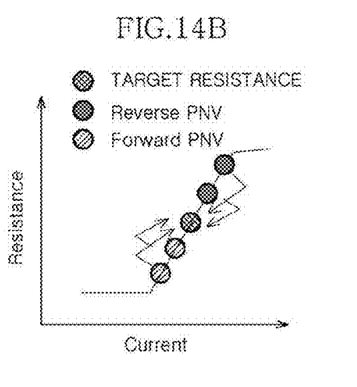

FIGS. 14A and 14B are illustrative views illustrating the PNV concept of a resistive memory device.

In the related art, as illustrated in FIG. 14A, since PNV is performed only through a current path formed to one direction, that is, from the bit line side to the word line side, the phase-separation of a data storage material is necessarily caused as the number of operations is increased.

On the other hand, in the embodiment of inventive concept, as illustrated in FIG. 14B, a current path may be changed in the performing of the PNV, for example, the forward directional programming is performed in the current incremental type PNV operation, whereas the reverse directional programming is performed in a current decremental type PNV operation.

Therefore, since the element distribution state is refreshed before the phase-separation of elements constituting a data storage material is formed, operation reliability of the memory device may be improved and lifespan of the memory device may be increased.

FIG. 15 is a block diagram illustrating a resistive memory device 300 according to an exemplary embodiment of the inventive concept.

Referring to FIG. 15, the resistive memory device 300 may include a memory cell array 310, a write control circuit 330, a read control circuit 340, an input/output buffer 350, a control unit 360, and a path setting circuit 370.

Each of a plurality of unit memory cells included in the memory cell array 130 may include the memory cell 10 illustrated in FIG. 5. Further, each of the unit memory cells within the memory cell array 310 are connected to a respective word line WL and a respective bit line BL.

The control unit 360 receives an external command signal CTRL and an external address ADD, including a row address and a column address, decodes the row address and the column address, and generates a path control signal C_PNV, a forward program command PNVF, and a reverse program command PNVR, in which the address information for the unit memory cell to be accessed within the memory cell array 310 may be incorporated. The write control circuit 330 receives data DATA from the input/output buffer 350, and provides the data DATA to the path setting circuit 370 under control of the control unit 360.

The path setting circuit 370 is connected between the bit line and the word line. The path setting circuit 370 receives a program pulse PGM_pulse provided from the write control circuit 330, and performs a program operation by providing a forward current path and a reverse current path via the selected bit line and the selected word line based on a path control signal C_PNV, a forward program command PNVF, and a reverse program command PNVR provided from the control unit 360. As described above, the program pulse may be provided in an AC type in the forward/reverse directional programming.

The read control circuit 340 provides the data read from the selected unit memory cell within the memory cell array 310 to the input/output buffer 350 under control of the control unit 360.

In the resistive memory device 300, since a polarity applied to a data storage material constituting a unit memory cell is changed according to a predetermined criterion, a distribution state of elements constituting a data storage material may be refreshed. Therefore, high reliability of the memory device 300 may be ensured and lifespan of the resistive memory device may be increased.

In the exemplary embodiment of the inventive concept, the write control circuit 330 and the path setting circuit 370 may be composed to write control unit 30.

Figure 16:
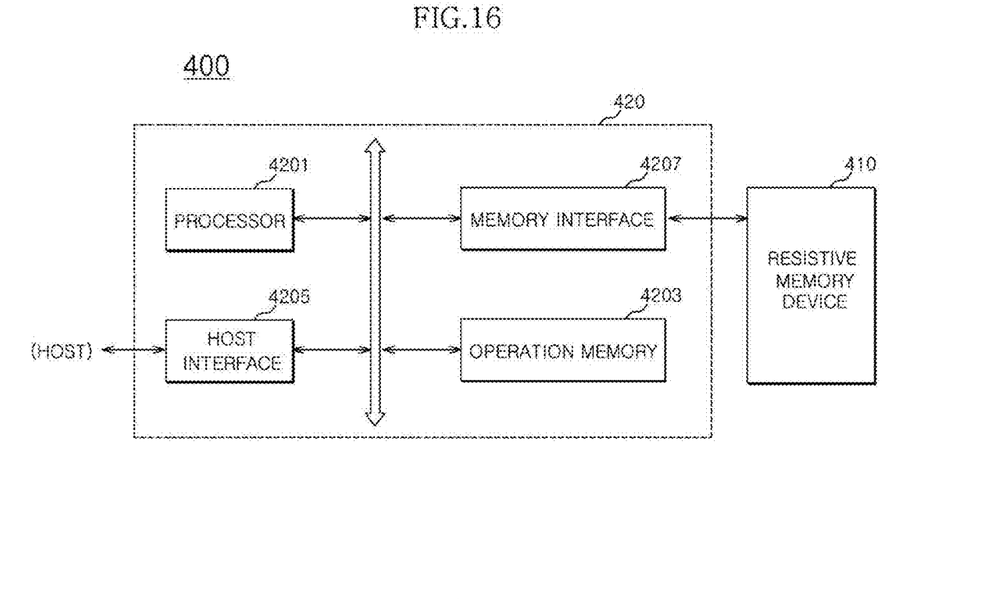
FIG. 16 is a block diagram illustrating a data processing system according to an exemplary embodiment of the inventive concept.

FIG. 16 is a block diagram illustrating a data processing system 400 according to an exemplary embodiment of the inventive concept.

The data processing system 400 may include a memory controller 420 connected between a host and a resistive memory device 410.

The memory controller 420 may access the resistive memory device 410 in response to request of the host, and therefore the memory controller 420 may include a processor 4201, an operation memory 4203, a host interface 4205, and a memory interface 4207.

The processor 4201 may control an overall operation of the memory controller 420, and the operation memory 4203 may store an application, data, a control signal, and the like required for operation of the memory controller 420.

The host interface 4205 may perform protocol conversion for data/control signal exchange between the host and the memory controller 420, and the memory interface 4207 may perform protocol conversion for data/control signal exchange between the memory controller 420 and the resistive memory device 410.

The resistive memory device 410 may include a memory cell array including a data storage material and an interconnection-connection type bidirectional access device connected thereto in series as a unit memory cell, for example, as shown in FIG. 5, and a path setting circuit configured to form a current path to a forward direction or a reverse direction in an PNV operation of the memory cell array. In particular, the interconnection-connection type bidirectional access device has terminals, through which current is input and output, connected to a bit line and a word line through interconnections, and thus is configured to supply an AC bias to the data storage material. Therefore, the path setting circuit may apply the AC type program pulse to the unit memory cell to the forward direction or the reverse direction according to the set current path to perform a PNV operation.

In the exemplary embodiment of the inventive concept, the data processing system illustrated in FIG. 16 may be a memory card, but it is not limited thereto.

Figure 17:
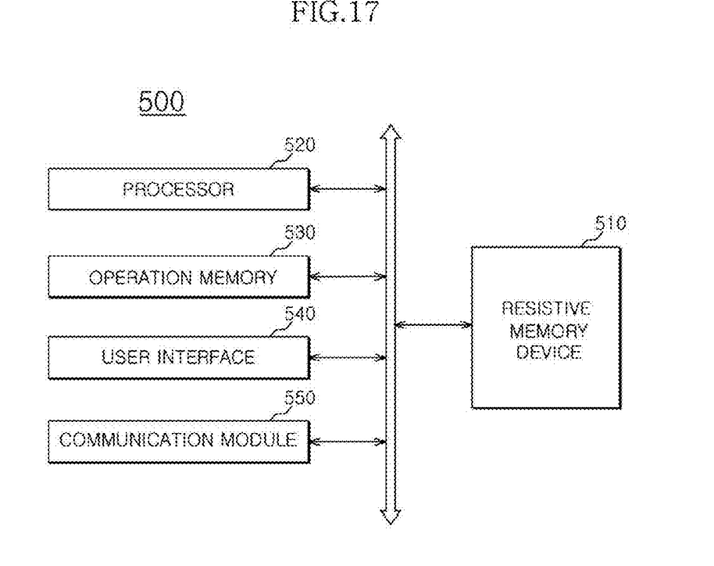
FIG. 17 is a block diagram illustrating a data processing device according to another exemplary embodiment of the inventive concept.

FIG. 17 is a block diagram illustrating a data processing system 500 according to another exemplary embodiment of the inventive concept.

The data processing system 500 may include a resistive memory device 510, a processor 520, an operation memory 530, and a user interface 540, and if necessary, the data processing system 500 may further include a communication module 550.

The processor 520 may be a central processing unit (CPU), and the operation memory 530 stores an application program, data, a control signal, and the like required for an operation of the data processing system 500. The user interface 540 may provide an environment in which a user accesses to the data processing system 500, and provides a data processing process, a result, and the like of the data processing system 500 to the user.

The resistive memory device 510 may include a memory cell array including a data storage material and an interconnection-connection type bidirectional access device connected thereto in series as a unit memory cell, for example, as shown in FIG. 5, and a path setting circuit configured to form a current path to a forward direction or to a reverse direction in a PNV operation of the memory cell array. In particular, the interconnection-connection type bidirectional access device has terminals, through which current is input and output, connected to a bit line and a word line through interconnections, and thus is configured to supply an AC bias to the data storage material. Therefore, the path setting circuit may apply the AC type program pulse to the unit memory cell to a forward direction or the reverse direction according to the set current path to perform a PNV operation.

The data processing systems illustrated in FIGS. 16 and 17 may be used as a disc apparatus, an internal/external memory card of a portable electronic apparatus, an image processor, or application chipsets.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. An operation method of a resistive memory device including a unit memory cell, which includes a data storage material coupled to a first interconnection, a non-silicon-substrate-based type bidirectional access device coupled between the data storage material and a second interconnection, and a path setting circuit suitable for providing a plurality of program pulses to the unit memory cell, the operation method comprising:
    applying first program pulses of the plurality of program pulses to a side of the first interconnection from the path setting circuit in at least portion of cycles of a program operation based on a program command; and
    applying second program pulses of the plurality of program pulses to a side of the second interconnection from the path setting circuit in the remaining cycles of the program operation based on the program command.

2. The operation method of claim 1, wherein the first program pulses and the second program pulses have the same shape.

3. The operation method of claim 1, wherein the first program pulses and the second program pulses are alternately supplied.

4. The operation method of claim 1, wherein each of the second program pulses is supplied between supplies of the first program pulses.

* * * * *